(12) United States Patent
Chow et al.

(10) Patent No.: US 6,705,524 B2
(45) Date of Patent: Mar. 16, 2004

(54) METHODS AND APPARATUS FOR PREVENTING DAMAGE TO MEMORY CARDS, MEMORY CARD CONNECTORS AND OTHER ELECTRONIC DEVICES

(75) Inventors: Vivian Wei Chow, Poway, CA (US); George Craig Lysy, San Diego, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 84 days.

(21) Appl. No.: 09/745,206

(22) Filed: Dec. 19, 2000

(65) Prior Publication Data

US 2001/0000764 A1 May 3, 2001

Related U.S. Application Data

(62) Division of application No. 09/417,271, filed on Oct. 13, 1999.

(51) Int. Cl.⁷ .................................................. G06K 7/06
(52) U.S. Cl. .................... 235/441; 235/482; 235/485; 235/486; 439/677; 439/678; 439/680
(58) Field of Search ..................... 235/441, 482–486; 439/137, 678, 79, 677, 674, 630, 680; 361/736, 737

(56) References Cited

U.S. PATENT DOCUMENTS

| | | | |
|---|---|---|---|
| 4,712,848 A | 12/1987 | Edgley | |
| 4,933,540 A | 6/1990 | Omori et al. | 235/492 |
| 5,350,309 A | 9/1994 | Abukawa et al. | 439/138 |
| 5,408,384 A | 4/1995 | Gannyo et al. | 361/737 |
| 5,581,127 A | * 12/1996 | Shinohara | 235/492 |
| 5,589,719 A | * 12/1996 | Fiset | 439/79 |
| 5,973,924 A | 10/1999 | Gillespie, Jr. | 361/735 |
| 5,980,294 A | 11/1999 | Kanda et al. | 439/326 |
| 6,033,253 A | 3/2000 | Yi et al. | |
| D425,486 S | 5/2000 | Nishio et al. | D13/147 |

* cited by examiner

Primary Examiner—Michael G. Lee
Assistant Examiner—Steven S. Paik

(57) ABSTRACT

Methods and apparatus for preventing damage to memory cards, memory card connectors, host electronics, and other electronic devices by only allowing intended electronic devices to mate with the connector for which it is intended and/or determining when an electronic device has been inserted into a connector upside down.

10 Claims, 9 Drawing Sheets

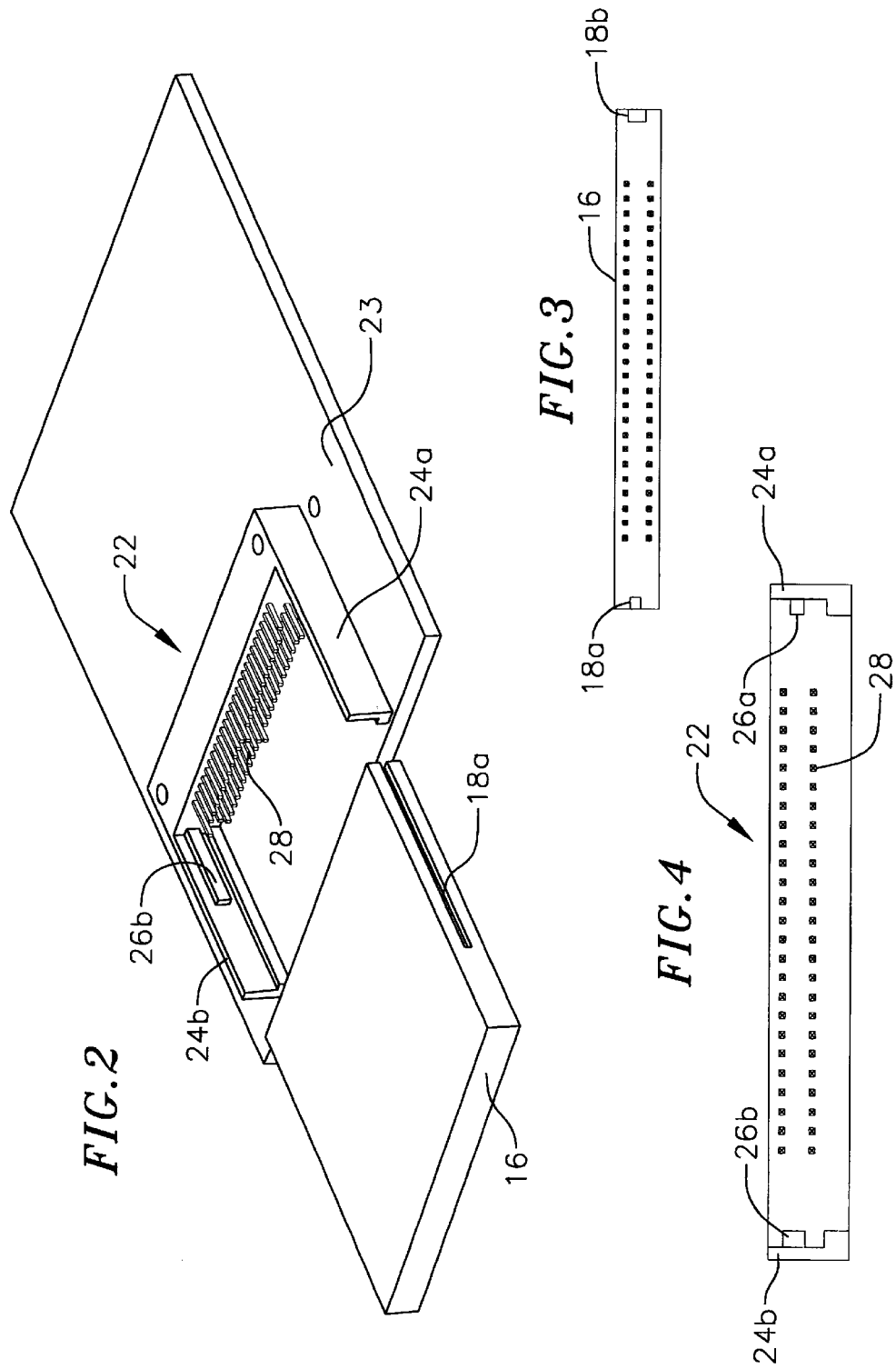

METHODS AND APPARATUS FOR PREVENTING DAMAGE TO MEMORY CARDS, MEMORY CARD CONNECTORS AND OTHER ELECTRONIC DEVICES

CROSS REFERENCE TO RELATED APPLICATION(S)

This is a divisional of copending application Ser. No. 09/417,271 filed on Oct. 13, 1999.

BACKGROUND OF THE INVENTIONS

1. Field of the Inventions

The present inventions relate generally to electronic devices and, more particularly, to the prevention of damage that can occur when users attempt to improperly connect electronic devices to one another.

2. Description of the Related Art

There is a virtually unlimited number of instances where one electronic device is connected to another. Many times, electrical devices will be damaged when they are not connected properly or are connected to a device other that for which connection was intended. This problem is especially acute when the devices are small and when a variety of similar devices are available for essentially the same purpose. One example of such an electronic device is the memory card. Memory cards, which are relatively small devices that are frequently used to store electronic data, have a wide variety of storage applications. A common application is the storage of digitized still or motion images recorded with a digital camera. The memory card may be easily removed from the camera and connected to a personal computer, digital picture frame or printer. Another common application is the storage of sound data, such as musical works that have been downloaded from the internet. Users can, for example, download a musical work with their personal computer, store it on a memory card that is connected to the computer with a suitable adapter or printer card slot, remove the memory card, and then insert the card into a portable player for enjoyment at a remote location. Other applications include laptop computers, palmtop computers, personal digital assistants, and smart cellular telephones and pagers.

Memory cards include a storage medium, such as a flash memory device or a miniature hard disk storage device, that is located within a protective housing. The storage medium is connected to multiple pin sockets, multiple pin contact pads or some other series of multiple electrical contacts that are either located on, or are accessible through, the exterior of the housing. The electronic device used in conjunction with the memory card (or "host device") will include an I/O port with a connector having a corresponding series of pins or other electrical contacts. The pins mate with the sockets or contact pads in the memory card when the memory card is properly inserted into I/O port, thereby electrically connecting the memory card to the host device.

A wide variety of memory cards are available. Digital cameras are typically designed to accept the Compact Flash memory card, of which there are presently two types. The Type I card is 36 mm long, 42 mm wide and 3.3 mm thick, while the Type II card is 36.4 mm long, 42.8 mm wide and 5 mm thick. Digital music recording and playback devices are typically designed to accept either the SmartMedia memory card, which is 45 mm long, 37 mm wide and 0.8 mm thick, or the Multimedia card, which is 32 mm long, 24 mm wide and 1.4 mm thick. Certain digital cameras also accept the SmartMedia card. Some companies have developed their own standard memory card, which can be used in a variety of devices produced by that particular company. The Sony Memory Stick, which is 50 mm long, 21.6 mm wide and 2.8 mm thick, is one example of such a company specific memory card. The pin sockets or contact pads are associated with an edge of the housing that defines the width of the memory card and I/O ports are typically dimensioned to accept particular memory cards. Thus, in the case of a Type I Compact Flash memory card, a corresponding I/O port would have an entrance that is about 42 mm wide and about 3.3 mm high and would also have a connector with a series of pins arranged such that they will mate with the sockets or contact pads when the memory card is inserted.

Given the relatively small size of memory cards and the availability of a wide variety of similarly sized cards, it is not surprising that users make mistakes when attempting to use the cards. For example, users may attempt to insert a memory card into an I/O port sideways in those instances where the memory card, such as a Compact Flash memory card, is wider than it is long. Users will also insert one type of memory card into an I/O port that is designed for another type of memory card. In either event, the typical result is irreversible damage to the connector pins within the digital camera, printer, music player or other host device.

Another common user mistake is the placement of a memory card into its intended I/O port upside down. In those instances where the sockets or contact pads are symmetrical, such as in a Compact Flash memory card, the pins in the I/O port connector will mate with the sockets or contact pads and an electrical connection will be made with the host device despite the fact that the card is upside down. However, because the memory card is upside down, the individual pins will not be connected to the proper sockets or contact pads. In the case of the Compact Flash memory card, outputs from the associated electronic device will drive outputs on the memory card, thereby damaging the card or host device.

One conventional solution to the problem of users inserting memory cards into I/O ports upside down is to mechanically key the memory card and I/O port by including differently sized slots on the sides of the card and correspondingly sized rails on each side of the port. The inventors herein have determined that this solution is less than satisfactory because the keying features are nearly the same. For example, the wrong type of memory card can still be forced into the I/O port in those instances where the card has a side that is narrower than the entrance to the I/O port. Another problem is particular to the Compact Flash memory cards. The inventors herein have determined that Type I Compact Flash memory cards can be forced, either upside down or sideways, into an I/O port that is designed to accept both Type I and Type II Compact Flash memory cards.

Another conventional solution to the problem of improperly inserted memory cards is electronically determine whether the card has made a proper electrical connection with the host device prior to the commencement of card based operations. Compact Flash memory cards, for example, have two symmetrically located internally grounded pin sockets or pin contact pads that are used for card detection purposes and are often referred to as nCD1 and nCD2 contacts. When the Compact Flash memory card is properly inserted into the intended I/O port, the nCD1 and nCD2 contacts will be connected to a pair of card detect lines and to a pair of pullup resistors in the manner illustrated in FIG. 8. The host device (such as a printer) uses a hardware, software or firmware based detection system to determine whether the card detect lines are connected to ground, i.e. whether the logic signals from on the card detect lines are "0." If the logic signals from both card detect lines are "0," then the system determines that the memory card has been properly installed and card based operations may proceed. If one of the logic signals is "1" and the other is "0," then the system determines that the memory card is improperly installed and provides a message to the user (typically on the display of the associated device). Finally, if both of the logic signals are "1," the system determines that the memory card has not been installed.

The inventors herein have determined that the conventional method checking the logic signals associated with the nCD1 and nCD2 contacts in a Compact Flash memory card is susceptible to improvement because the conventional method will not detect when the memory card has been inserted into its intended I/O port upside down. This is because the nCD1 and nCD2 contacts are symmetrically located on the memory card. As such, when the memory card is inserted into the I/O port upside down, both of the card detect lines will be connected to a grounded contact on the memory card (albeit the wrong one) and the firmware or hardware will see logic "0" signals on each of the card detect lines. Card based operations will then be enabled, which can result in damage to the memory card or host device.

SUMMARY OF THE INVENTIONS

Accordingly, one object of the present inventions is to provide apparatus that avoids, for practical purposes, the aforementioned problems in the art. In particular, one object of the present inventions is to provide apparatus that will prevent electronic devices from being improperly connected to one another. Another object of the present inventions is to provide apparatus that will prevent memory cards from being inserted into I/O ports other than those for which they are intended. Still another object of the present inventions is to provide apparatus and methods for determining when one electronic device has been improperly connected to another electronic device. Yet another object of the present inventions is to provide apparatus and methods for determining when a memory card has been inserted into an I/O port upside down.

In order to accomplish some of these and other objectives, a connection control apparatus in accordance with one embodiment of a present invention includes a blocking member movable between open and closed positions and a cam surface associated with at least one of the lateral edges of the blocking member. The blocking member will prevent memory cards (or other devices) from passing unless the memory card engages the cam surface and raises the blocking member as it enters the associated I/O port. In a preferred implementation, the blocking member consists of two separately movable blocking member portions, each having a relatively thin cam surface at its outer lateral edge. The cam surfaces are spaced apart by a distance corresponding to the width to the intended memory card (or other device). Only the intended memory card in its proper orientation can simultaneously engage both cam surfaces to raise both blocking members and gain access to the electrical connector. As such, the present connection control apparatus prevents the damage caused by users inserting memory cards into I/O ports sideways and inserting the memory cards into I/O ports for which they are not intended.

In order to accomplish some of these and other objectives, methods and apparatus in accordance with other present inventions determine the presence and orientation of a device, such as a memory card, by sensing the status of asymmetrically arranged contacts on the device. Because the contacts are asymmetrically arranged, they will not be located in the same place when the device is inserted into an I/O port upside down as they will be when the device is inserted correctly. This allows the present methods and apparatus to determine the orientation of the device as well as whether an electrical connection has been made. The present methods and apparatus are, therefore, an improvement over the conventional method of determining whether a device has been properly inserted into an I/O port.

The above described and many other features and attendant advantages of the present inventions will become apparent as the inventions become better understood by reference to the following detailed description when considered in conjunction with the accompanying drawings.

BRIEF DESCRIPTION OF THE DRAWINGS

Detailed description of preferred embodiments of the inventions will be made with reference to the accompanying drawings.

FIG. 2 is a perspective view of a memory card and memory card connector.

FIG. 3 is an end view of the memory card illustrated in FIG. 2.

FIG. 4 is an end view of the memory card connector illustrated in FIG. 2.

DETAILED DESCRIPTION OF THE PREFERRED EMBODIMENTS

Figure 1:
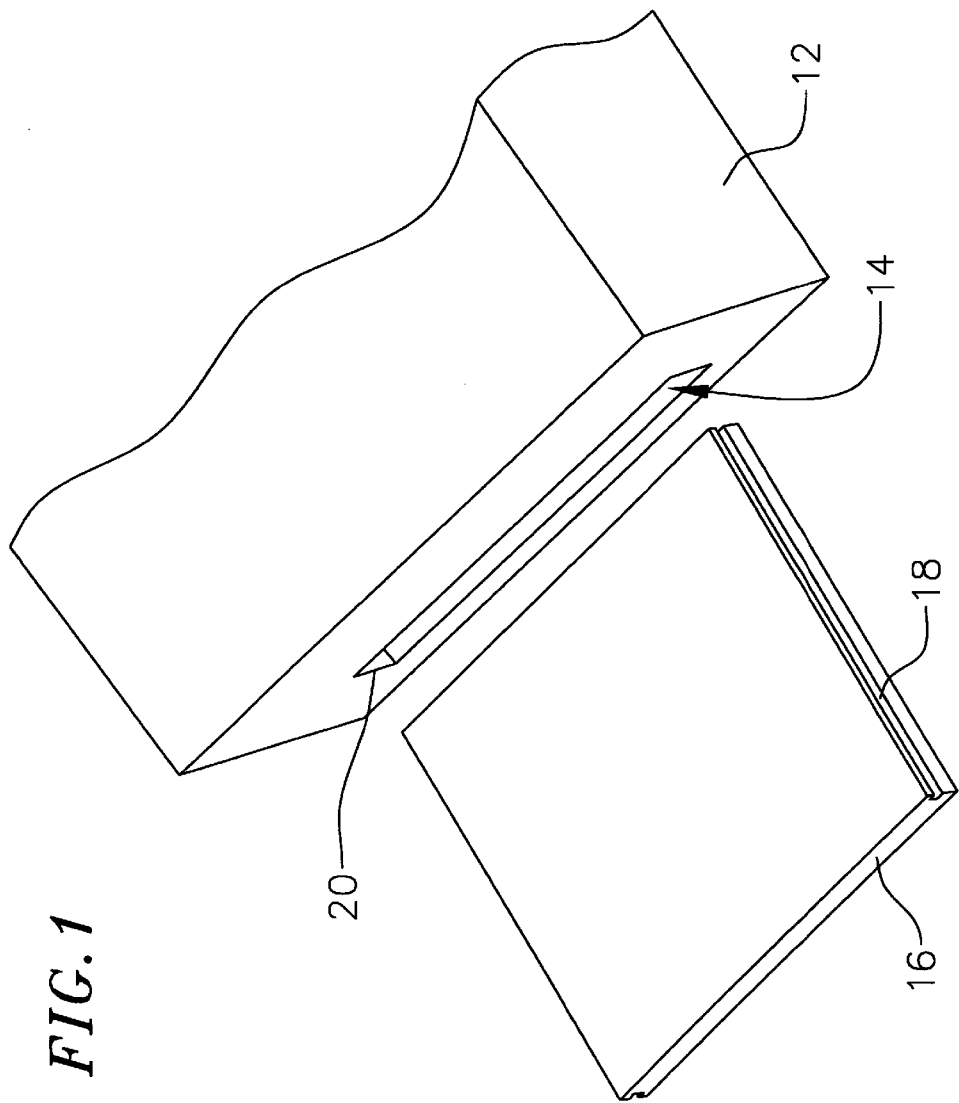
FIG. 1 is a perspective view of an electronic device and a memory card.

The following is a detailed description of the best presently known modes of carrying out the inventions. This description is not to be taken in a limiting sense, but is made merely for the purpose of illustrating the general principles of the inventions. Additionally, it is noted that detailed discussions of various internal operating components which are not pertinent to the present inventions, such as the internal operating components of memory cards and the host devices used therewith, have been omitted for the sake of simplicity.

The detailed description of the preferred embodiments is organized as follows:

I. Connection Control Apparatus
II. Connection Detection

The section titles and overall organization of the present detailed description are for the purpose of convenience only and are not intended to limit the present inventions.

This specification discloses apparatus and methods for preventing damage to electrical devices, mainly in the context of memory cards and the host devices that accept memory cards, because the present inventions are well suited for such use. Nevertheless, it should be appreciated that the apparatus and methods disclosed herein are applicable for use with other electrical devices. For example, the apparatus and methods disclosed herein may be used in conjunction with slot-type CD players, digital video players, credit card readers, non-mechanically keyed cable connections and any other peripheral devices that is can be hot swapped with a host device.

I. Connection Control Apparatus

As illustrated for example in FIGS. 1–4, connection control apparatus in accordance with the present inventions may be used in combination with an electronic device 10, including a housing 12 and an I/O port 14, and a memory card 16, including a pair of differently sized slots 18a and 18b that extend along the side edges thereof. The I/O port 14 consists essentially of a housing opening 20 and a memory card connector 22 located within the housing 12 on a printed circuit assembly 23. The memory card connector 22 includes a pair of side walls 24a and 24b with differently sized inwardly facing rails 26a and 26b, which correspond to the differently sized memory card slots 18a and 18b, and a series of pins 28 that mate with corresponding sockets or contact pads (not shown) on the memory card 16. The slot and rail arrangement helps to prevent the memory card 16 from being inserted into the I/O port 14 upside down.

Figure 5:
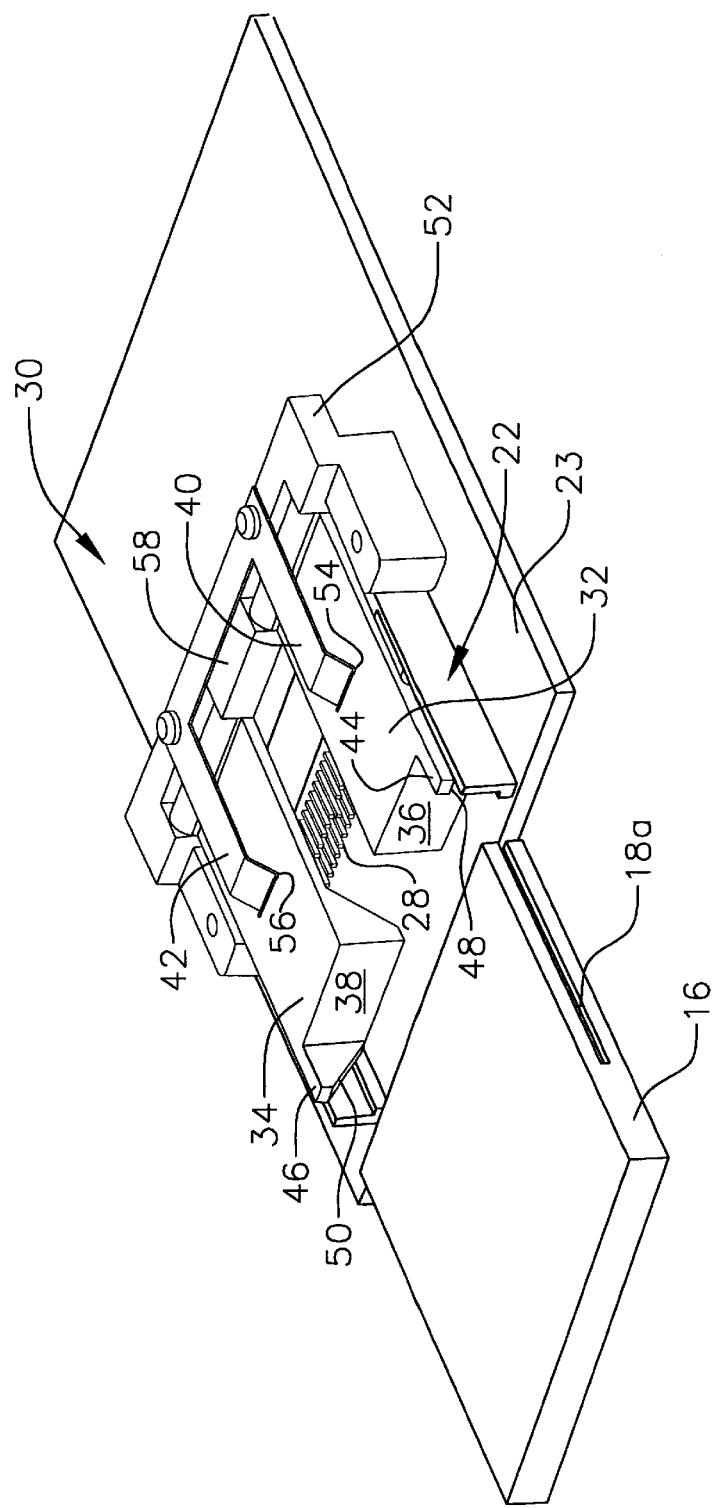
FIG. 5 is a perspective view of a connection control apparatus in conjunction with a preferred embodiment of a present invention.
Figure 6:
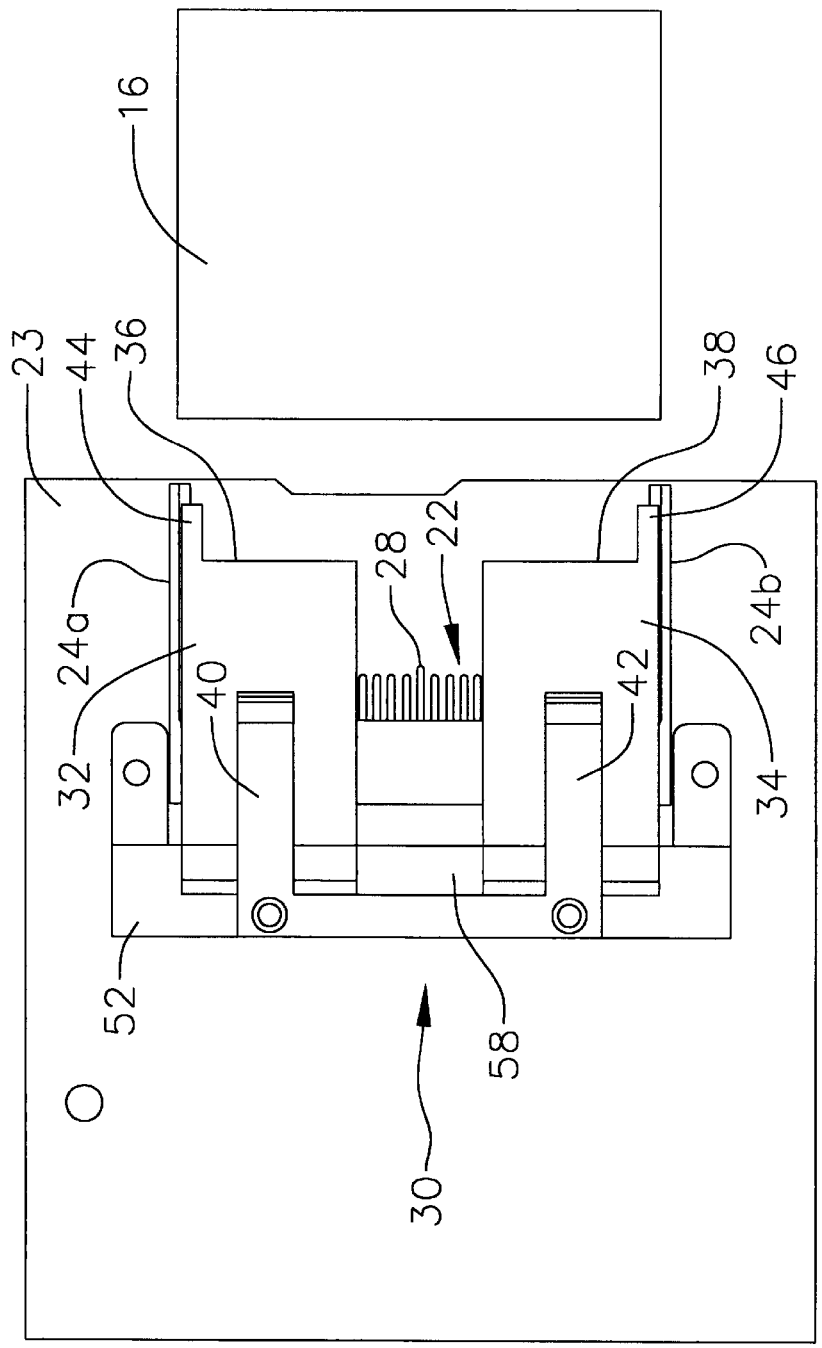
FIG. 6 is a top view of the connection control apparatus illustrated in FIG. 5.

The exemplary connection control apparatus illustrated in FIGS. 5 and 6, which is generally represented by reference numeral 30, is located within the housing 12 and is positioned adjacent the memory card connector 22 in the manner shown. The connection control apparatus 30 includes a pair of blocking members 32 and 34 with respective blocking surfaces 36 and 38. The blocking surfaces 36 and 38 are located between the housing opening 20 and the connector pins 28. The blocking members 32 and 34, which are movable between respective open and closed positions, are biased to the closed positions by a pair of springs 40 and 42. So biased, the blocking members 32 and 34 will remain in their closed positions and the blocking surfaces 36 and 38 will prevent memory cards and other objects from reaching the pins 28 until an opening force which opposes the springs 40 and 42 is applied to the blocking members.

In the preferred embodiment illustrated in FIGS. 5 and 6, the opening force is applied by the properly sized (or "intended") memory card 16 as it passes through the housing opening 20 and engages a pair of cam members 44 and 46 with respective cam surfaces 48 and 50. The lateral portions of the forward edge of the memory card 16 will slide along the cam surfaces 48 and 50 which, in turn, will urge the blocking members 32 and 34 upwardly. The cam members 44 and 46 are relatively thin (preferably about 1–1.5 mm) and are located at the outer lateral edges of the blocking members 32 and 34.

The spacing between the cam members 44 and 46 should be such that both cam members will only be engaged by the intended memory card 16. In a connection control apparatus that is intended for use with Type I and Type II Compact Flash memory cards, for example, the cam members 44 and 46 will preferably be separated by at least about 38 mm (to exclude SmartMedia cards) to about 39 mm measured from the inwardly facing sides of the cam members. With such spacing, the cam surfaces 48 and 50 will only be simultaneously engaged, and the blocking members 32 and 34 will only be simultaneously urged to their open positions, by a properly inserted Compact Flash memory card. An improperly sized (or "unintended") memory card that is narrower than the intended memory card will fail to engage both of the cam surfaces 48 and 50, as will a Compact Flash memory card that has been inserted into the housing opening 20 sideways. As a result, one or both of the blocking members 32 and 34 will remain in the closed position and one or both of the blocking surfaces 36 and 38 will prevent the memory card from reaching the pins 28. Unintended memory cards that are either thicker or wider than the intended memory card can be prevented from reaching the pins 28 by simply limiting the size of the housing opening 22 to that of the intended memory card.

The blocking members 32 and 34 in the exemplary connection control apparatus 30 illustrated in FIGS. 5 and 6 are pivotably mounted on a rod (not shown) that is carried by a frame 52. The springs 40 and 42, which are also carried by the frame 52, are not fixedly secured to the blocking members 32 and 34. Instead, the springs 40 and 42 include curved engagement surfaces 54 and 56 that are free to slide along the top surfaces of the blocking members 32 and 34 as the blocking members pivot relative to the frame 52.

The preferred embodiment illustrated in FIGS. 5 and 6 also includes a spacer 58 that is located between the blocking members 32 and 34. The width of the spacer 58 may be increased or decreased, and the width of the blocking members 32 and 34 correspondingly decreased or increased, to adjust the spacing between the blocking members as desired. The spacer 58 may also be eliminated so that blocking members 32 and 34 abut one another. Additionally, although somewhat less effective, the spacer 58 may be eliminated and the blocking members 32 and 34 combined into a single unitary structure.

Figure 7:
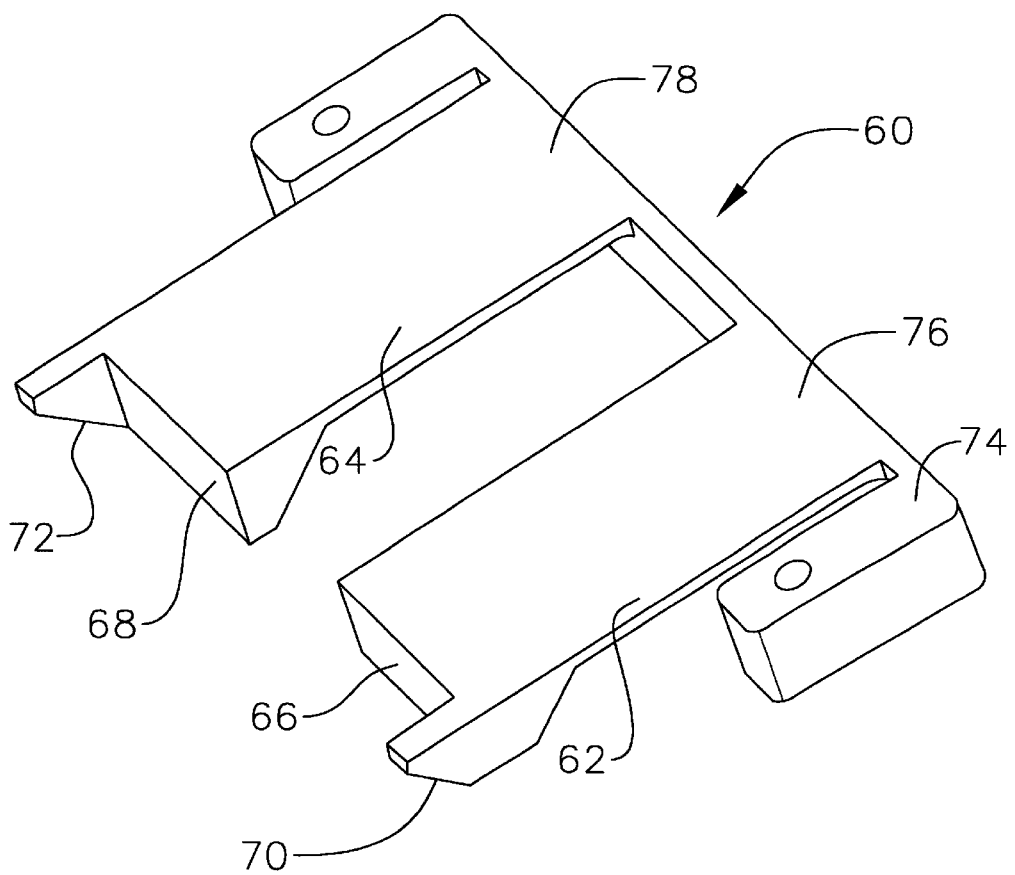
FIG. 7 is a perspective view of another connection control apparatus in conjunction with a preferred embodiment of a present invention.
Figure 8:
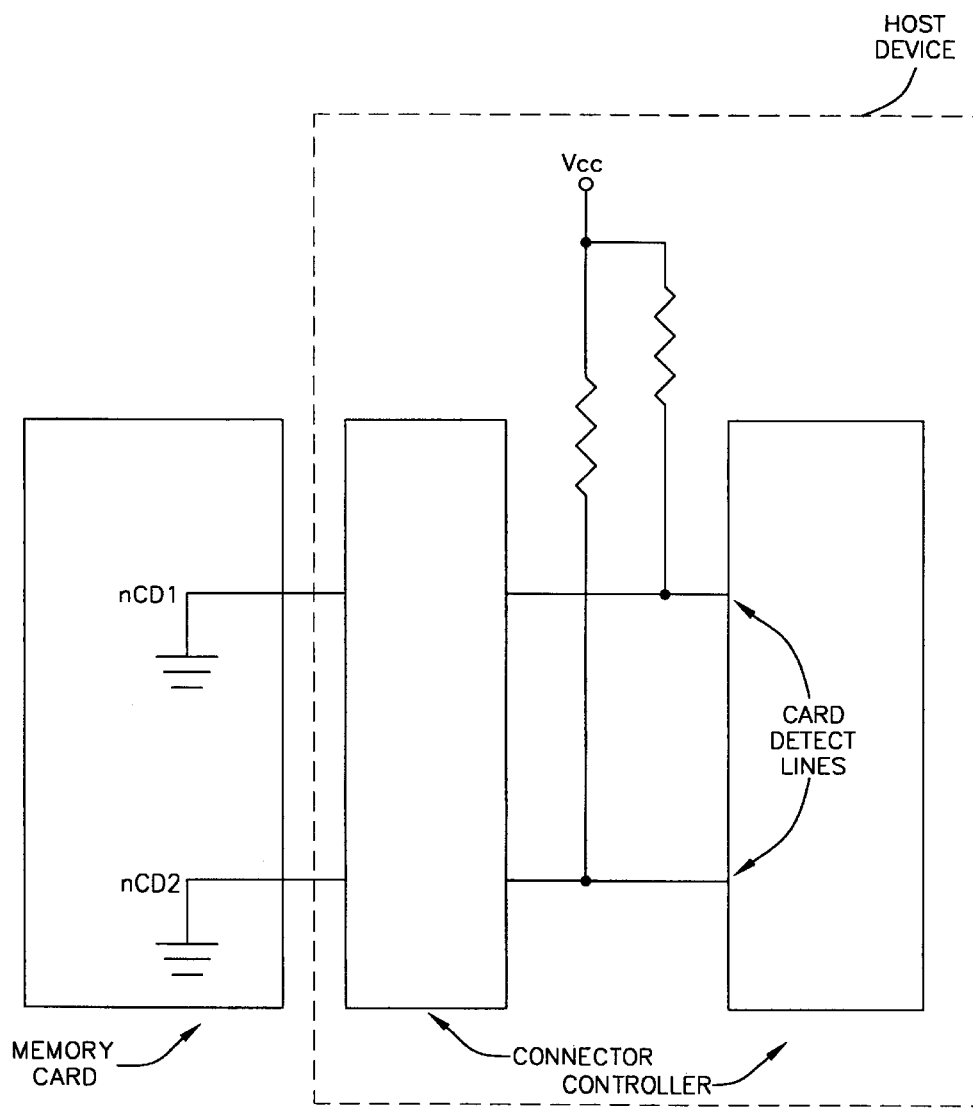
FIG. 8 is a diagram of a conventional apparatus for determining whether a memory card has been properly connected to a host device.

As illustrated for example in FIG. 7, a connection control apparatus 60 in accordance with another preferred embodiment of the present invention includes a pair of blocking members 62 and 64 with respective blocking surfaces 66 and 68 and cam surfaces 70 and 72. The blocking members are mounted on a frame 74. In contrast to the connection control apparatus 30 illustrated in FIGS. 5 and 6, the blocking members 62 and 64 in the connection control apparatus 60 are integral with the frame 74. Living hinges 76 and 78 allow the blocking members 62 and 64 to pivot relative to the frame 74 when a properly sized memory card (or other electronic device) engages the cam surfaces 70 and 72.

The dimensions and other particulars of the connection control apparatus 30 (or 60) will, of course, depend on the particular device with which it is used. In a device that accepts Type I and Type II Compact Flash memory cards, for example, the blocking members 32 and 34 will be about 25 mm long (measured from the tip of the cam members 44 and 46 to the portion that is mounted on the rod) and the distance between the outermost lateral edges of the blocking members will be about 41 mm, which is commensurate with the distance between the connector side walls 24a and 24b. The blocking surfaces 36 and 38 are about 6 mm in height. Each of the springs 40 and 42 will impart about 20–100 grams of force onto the associated blocking member 32 and 34, which is sufficient to insure that the blocking members will only move from the closed position when intended.

With respect to materials, the components of the connection control apparatus 30 (or 60) are preferably formed from plastic, such as glass filled plastic or carbon filled plastic. Some or all of the components may also be formed from metals such as steel. Additionally, compression spring may be substituted for the cantilevered springs 40 and 42.

Finally, it should be noted that the connection control apparatus 30 (or 60) may be used in combination with the connection detection system described below.

II. Connection Detection

Figure 9:
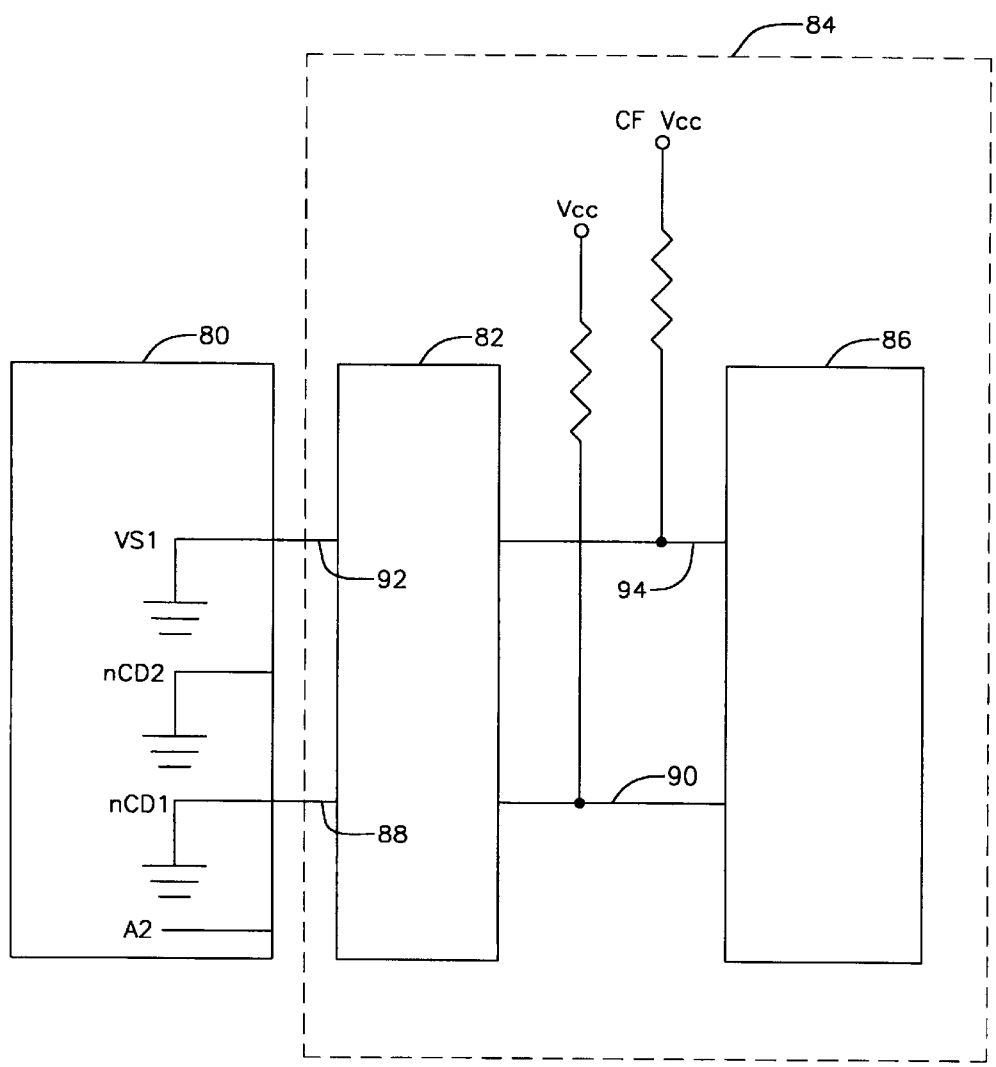
FIG. 9 is a diagram of an apparatus for determining whether a memory card has been properly connected to a host device in accordance with a preferred embodiment of a present invention.

As illustrated for example in FIG. 9, a conventional Compact Flash memory card 80, which is one example of an electronic device with which the present connection detection methods and apparatus may be employed, is connected to a connector 82 within the I/O port of a host device 84, such as a printer, digital camera, personal digital assistant or the like, that includes a control system. The term "control system" is used herein to describe any and all control circuitry and devices, such as hardware including application specific integrated circuits and custom gate arrays on the connector 82 and/or on a main control board 86, and software and firmware controls. The control system implements the conventional functions of the host device as well as the present connection detection functions. The memory card 80 may be connected to various power sources within the host device 84, such as Vcc, which is power that is applied whenever the host device is connected to a power source such as batteries or an AC wall outlet (typically 5V or 3.3V), and CF Vcc, which is power that is applied to the memory card that can be switched on and off with the control system (typically 5V or 3.3V, although it could be lower).

Although the conventional Compact Flash memory card 80 includes a total of fifty sockets, contact pads or other electrical contacts, and the connector 82 includes fifty corresponding pins, only those contacts and pins pertinent to the following discussion have been illustrated for the purposes of simplicity. Referring to FIG. 9, the Compact Flash memory card 80 includes a pair of symmetrically arranged card detection contacts nCD1 and nCD2, which are internally connected to ground, and a voltage sense contact VS1, that is also internally connected to ground. The voltage sense contact VS1 is not symmetrically located on the memory card with respect to either of the card detection contacts nCD1 and nCD2. The contact that is symmetrically located with respect to voltage sense contact VS1 is the address input contact A2, which is not grounded. As explained in greater detail below, the present inventions use the arrangement of grounded and ungrounded contacts to determine the orientation of a Compact Flash memory card or other device in addition to determining whether an electrical connection has been made.

It should be noted that the control circuitry will typically have the ability to tristate the outputs to the memory card 80. An application specific integrated circuit or custom gate array may be used to perform this function.

Figure 10:
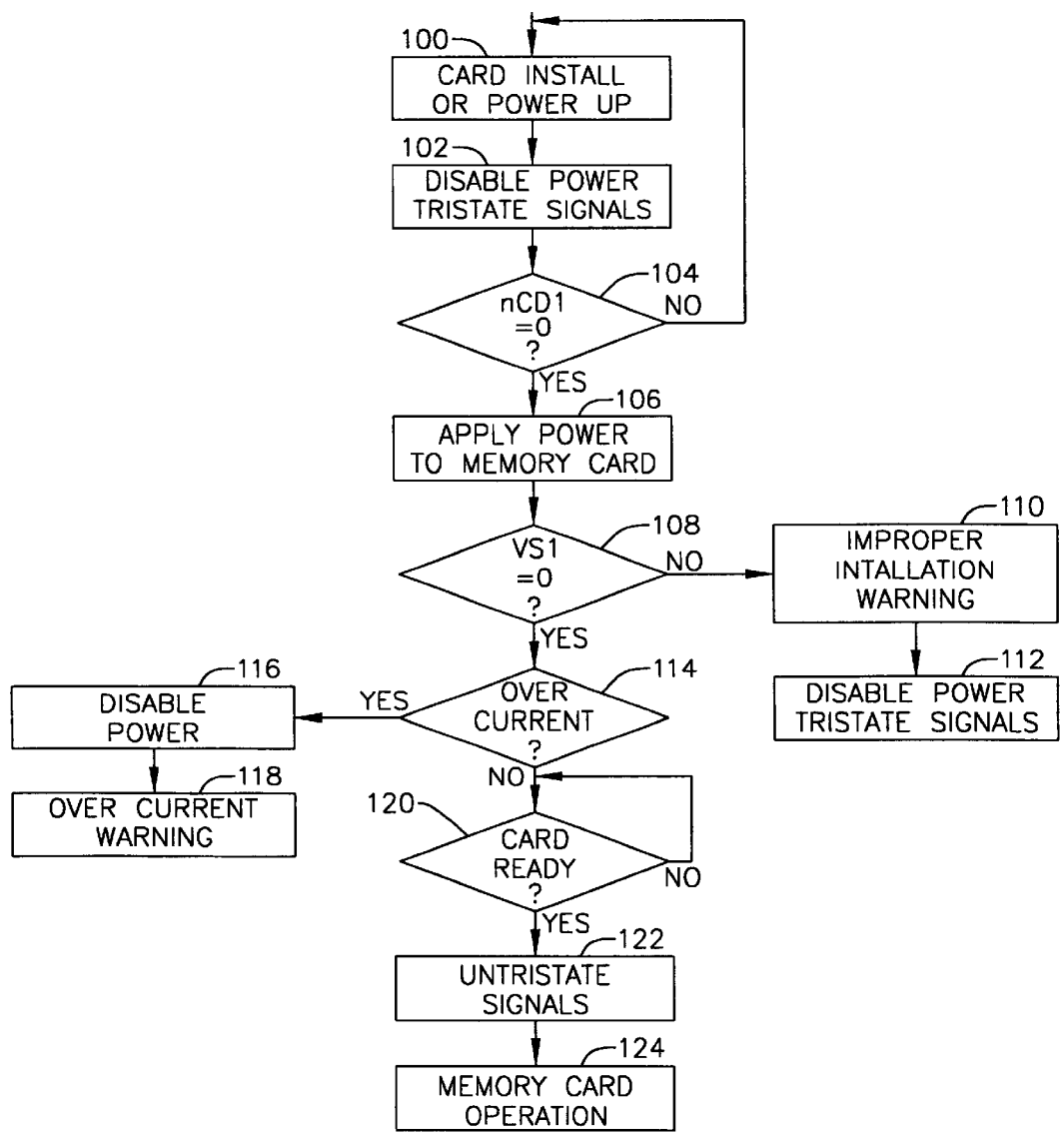
FIG. 10 is a flow chart illustrating a method of determining whether a memory card has been properly connected to a host device in accordance with a preferred embodiment of a present invention.

Referring to the flow chart presented in FIG. 10, a preferred implementation of the inventions will operate as follows. When the host device 84 is turned on, or when the memory card 80 is inserted into the I/O port of the host device (step 100), CF Vcc will be disabled and all signals to the memory card will be tristated (step 102). Next, the control system determines whether the memory card 80 has made electrical connection with the connector 82 (step 104). This is accomplished by determining whether connector pin 88 is connected to ground, i.e. whether the logic signal from card detect line 90 is "0." A "0" logic signal will be present whether or not the memory card 80 is inserted right side up or upside down because the grounded nCD1 and nCD2 connectors are symmetrically arranged.

In accordance with the preferred embodiment of the present inventions, the next step is to briefly enable CF Vcc and apply power to the memory card 80 (step 106). After a period sufficient to allow the CF Vcc voltage to stabilize, which should be on the order of 100–200 msec (although it may vary from one system to another, the control system will determine whether connector pin 92 is connected to ground, i.e. whether the logic signal from card detect line 94 is "0" (step 108). This will only occur if the memory card 80 was inserted properly and the grounded VS1 contact is connected to pin 92. If the memory card 80 was inserted upside down, connector pin 92 will be connected to the symmetrically arranged address input contact A2, which is not grounded, and the logic signal from card detect line 94 will be "1." Here, the user will be notified that the memory card 80 has been inserted improperly with an audible alarm and/or a visual display (step 110). CF Vcc will also be disabled to prevent damage to the memory card 80 and all signals to the memory card will be tristated (step 112).

Accordingly, it is the asymmetry of the grounded contacts that allows the present control system to determine the orientation of a memory card or other electrical device. It should also be noted here that, regardless of the device with which the present detection system is used, the asymmetric electrical contacts should not be power contacts because shorting power and ground can cause damage to both the card and the host.

Once it is determined that the memory card 80 has been properly inserted into the I/O port and connected to the connector 82, the control system determines whether there is an overcurrent condition (step 114), i.e. whether the memory card is shorted causing significant current draw. An overcurrent condition is generally an indication of a damaged memory card. The control system will disable CF Vcc in response to an overcurrent condition to prevent damage to the memory card (step 116) and notify the user with an audible alarm and/or a visual display (step 118). If no overcurrent condition exists, the control system determines whether the memory card 80 has produced its ready signal (step 120) and, once the ready signal has been received, untristates the signals to the memory card (step 122) and proceeds with memory card operations (step 124).

Figure 11:
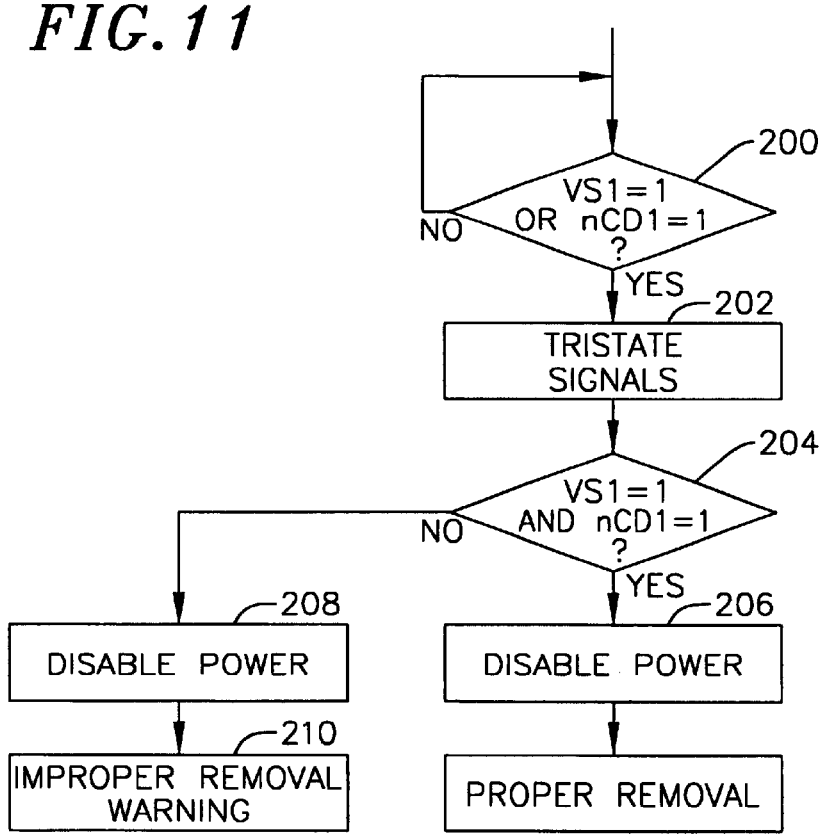
FIG. 11 is a flow chart illustrating a method of determining whether a memory card has been properly removed from a host device in accordance with a preferred embodiment of a present invention.

The exemplary control system will monitor memory card 80 after it has been properly connected to the host device 84. As illustrated for example in FIG. 11, when the user attempts to remove the memory card 80 (step 200), the control system will tristate all signals to the memory card (step 202). The control system will then determine whether the logic signals from card detect lines 90 and 94 are "1" (step 204). If both logic signals are "1," then the control system determines that the memory card 80 has been properly removed and CF Vcc is disabled (step 206). If not, CF Vcc is disabled (step 208) and the user is notified with an audible alarm and/or a visual display (step 210).

The exemplary control system may also be used in combination with the mechanical connection control apparatus described above.

Although the present inventions have been described in terms of the preferred embodiments above, numerous modifications and/or additions to the above-described preferred embodiments would be readily apparent to one skilled in the art. It is intended that the scope of the present inventions extend to all such modifications and/or additions.

We claim:

1. A method of determining the orientation of a first device including a plurality of electrical contacts relative to a second device, the method comprising the steps of:

determining whether a first one of the electrical contacts is connected to ground; and determining whether a second one of the electrical contacts is connected to ground, the first and second electrical contacts being asymmetrically located on the first device.

2. A method as claimed in claim 1, wherein the step of determining whether a first one of the electrical contacts is connected to ground comprises applying a voltage to the first electrical contact.

3. A method as claimed in claim 1, wherein the step of determining whether a second one of the electrical contacts is connected to ground comprises applying a voltage to the second electrical contact.

4. A method as claimed in claim 1, further comprising the step of:

tristating any signals to the first device prior to determining whether a first one of the electrical contacts is connected to ground.

5. An apparatus for use with an electronic device, the electronic device comprising a plurality of electronic device electrical contacts in a predetermined arrangement, the apparatus comprising:

an electrical connector adapted to accept the electronic device and including a plurality of connector electrical contacts in the predetermined arrangement, at least two of the connector electrical contacts being asymmetrically positioned in the predetermined arrangement; and a controller, operably connected to the electrical connector, adapted to determine the orientation of the electronic device in response to a predetermined status of the at least two asymmetrically positioned connector electrical contacts.

6. An apparatus as claimed in claim 5, wherein at least two of the electronic device electrical contacts are asymmetrically positioned in a manner corresponding to the at least two asymmetrically positioned connector electrical contacts and the at least two asymmetrically positioned electronic device electrical contacts are connected to ground.

7. An apparatus as claimed in claim 5, wherein the predetermined status comprises a connection of each of the at least two asymmetrically positioned connector electrical contacts to a grounded electronic device electrical contact.

8. An apparatus as claimed in claim 5, wherein the electronic device comprises a memory card having a predetermined shape and the electrical connector is associated with an I/O port having an entrance corresponding to the predetermined shape.

9. An apparatus as claimed in claim 5, wherein the connector electrical contacts comprise pins.

10. An apparatus as claimed in claim 5, wherein the electronic device electrical connectors comprise contact pads.

* * * * *